United States Patent [19]

Aoyama et al.

[11] Patent Number: 4,733,377
[45] Date of Patent: Mar. 22, 1988

[54] ASYNCHRONOUS SEMICONDUCTOR MEMORY DEVICE

[75] Inventors: Keizo Aoyama, Yamato; Kenji Agatsuma; Yasuaki Suzuki, both of Kawasaki, all of Japan

[73] Assignee: Fujitsu Limited, Kawasaki, Japan

[21] Appl. No.: 536,325

[22] Filed: Sep. 27, 1983

[30] Foreign Application Priority Data

Oct. 4, 1982 [JP] Japan ................. 57-174287

[51] Int. Cl.⁴ .............................. G11C 8/00
[52] U.S. Cl. ..................... 365/230; 365/227
[58] Field of Search ............ 365/189, 200, 230, 227

[56] References Cited

U.S. PATENT DOCUMENTS 4,031,415 6/1977 Redwine et al. ............. 365/205
4,337,525 6/1982 Akatsuka ..................... 365/233
4,338,679 7/1982 O'Toole ....................... 365/203

FOREIGN PATENT DOCUMENTS 2092851 8/1982 United Kingdom ............. 365/230

OTHER PUBLICATIONS

Patents Abstracts of Japan, vol. 2, No. 150, Dec. 15, 1978, p. 9468 E 78; JP-A-53 117 342 (Nippon Denki K.K.) 13-10-1978.

Primary Examiner—James W. Moffitt
Attorney, Agent, or Firm—Staas & Halsey

[57] ABSTRACT

An asynchronous semiconductor memory device having an address change detector which generates a pulse with a specified pulse width by detecting change in an address signal and a component for holding an internal circuit in the non-operating condition responding to the address signal for a period when said pulse does not exist. The internal circuit is caused not to operate in response to an unwanted address signal generated in the course of the change of the address signal input from an external device, or in response to an unwanted address signal generated by noise. Thereby power consumption is reduced.

4 Claims, 20 Drawing Figures

ASYNCHRONOUS SEMICONDUCTOR MEMORY DEVICE

BACKGROUND OF THE INVENTION

This invention relates to an asynchronous semiconductor memory device and more specifically to a semiconductor memory device which has reduced power consumption as a result of holding an internal circuit to a non-operative condition in response to any change of address signal for a specified period following the change of said address signal.

An asynchronous semiconductor memory device is not restricted in input timing of address information and operates immediately in response to change of the external input address signal.

On the other hand, in the case wherein a semiconductor memory device is mounted on a printed circuit board, the rising time and falling time of respective signals on a plurality of address signal lines connected to a semiconductor memory device disperse due to the dispersion of wiring capacitance on a printed circuit board. If signals on a plurality of address signal lines change with some scattered deviation in the timing, the following problem occurs.

For example, when a microprocessor connected to a semiconductor memory device changes the address information from "a" to "b", the unwanted address information "c" is generated because of a deviation of timing of the change of signal.

Since an asynchronous semiconductor memory device operates immediately in response to change of address as explained above, it also responds to such unwanted address information "c" and internal circuits starts the memory cell selecting operation in correspondance to the address information "c". Since the address information "c" is generated within a short period, the selecting operation of the memory cell corresponding to the address information "b" is started before data of the memory cell corresponding to the address information "c" is transmitted to an output buffer, an erroneous data is hardly ever output, but since the condition of the internal circuit changes, power is undesirably consumed. Such power consumption also occurs when noise is added to the address signal lines.

SUMMARY OF THE INVENTION

It is an object of this invention to provide an asynchronous semiconductor memory device which eliminates the above problems and reduces power consumption.

According to this invention, an asynchronous semiconductor memory device comprises an internal circuit which receives an address signal and operates in accordance with such address signal, a means for detecting change of said address signal and which generates a detection output, and a means which holds said internal circuit in the not-operating condition in response to said address signal for a specified period from the change of said address signal in accordance with said detection output.

DESCRIPTION OF THE PREFERRED EMBODIMENTS

The preferred embodiment of this invention is explained in detail in comparison with the prior art with reference to the drawings.

Figure 1:
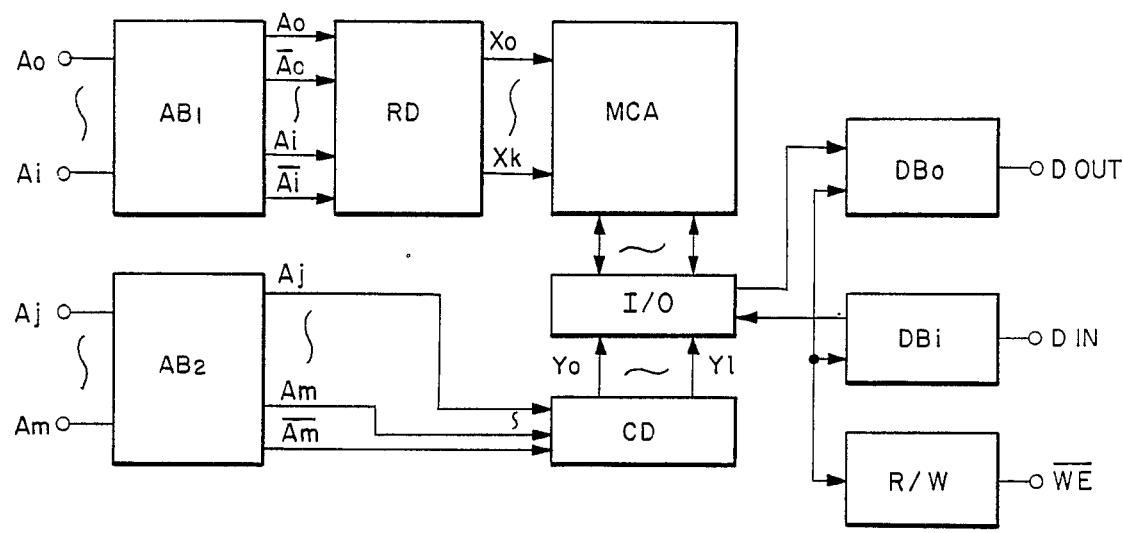
FIG. 1 is a block diagram indicating a general asynchronous semiconductor memory device.

FIG. 1 is a block diagram of an ordinary asynchronous semiconductor memory device. In this figure, $AB_1$, $AB_2$ are address buffers; RD is a row decoder; CD is a column decoder; MCA is memory cell array; I/O is an I/O gate; $DB_0$ is a data output buffer; $DB_i$ is a data input buffer; R/W is a read/write controller; $A_0 \sim A_i$ are row address signals; $A_j \sim A_m$ are column address signals; $X_0 \sim X_k$ are row selection signals; $Y_0 \sim Y_l$ are column selection signals; $D_{out}$ is an output data; $D_{in}$ is an input data; $\overline{WE}$ is a write enable signal.

Such an asynchronous semiconductor memory device immediately follows change of the address signals $A_0 \sim A_m$ and performs the decoding operation at the row decoder RD and the column decoder CD. A single word line (not shown) in the memory cell array is selected by the row selection signal X and a single data on plurality of bit lines (not shown) is selected by the column selection signal Y, and thereby such data is output through the I/O gate and data output buffer $DB_0$.

Figure 2:
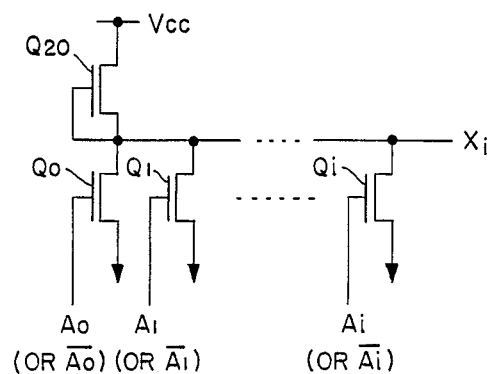
FIG. 2 is a schematic diagram of conventional decoder circuit.

The row decoder RD of a number of FIG. 1 is composed of the decoder circuit such as shown in FIG. 2, the number being equal to the number of row selection signals $X_0 \sim X_k$, and each decoder circuit outputs selection signal when the respective combination of the specified address signals is input. In FIG. 2, $Q_{20}$ is a depletion type MOS transistor, $Q_0 \sim Q_i$ are enhancement type MOS transistors. When all of the input address signals become low level, the row selection signal X becomes high level. In addition, the column decoder CD is also configured in the same way.

Figure 3A:
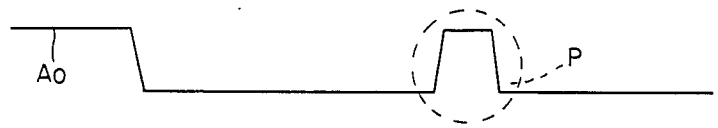
FIG. 3A through FIG. 3H show waveforms for explaining operations of a conventional asynchronous semiconductor memory device.
Figure 3B:
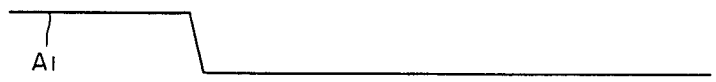
Figure 3C:

Unwanted power consumption as mentioned above is generated particularly in the input stages of the row and column decoders as is explained with reference to FIG. 3A~FIG. 3H. For convenience of explanation, it is supposed that the 3-bit address signals $A_0 \sim A_2$ are input. FIG. 3A~FIG. 3C respectively indicate the address signals $A_0 \sim A_2$, while FIG. 3D indicates the address data "a"~"d" composed of combination of $A_0 \sim A_2$ and FIG. 3E~FIG. 3H indicate outputs $X_a \sim X_d$ of the decoder circuit corresponding to address data "a"~"d".

Figure 3D:
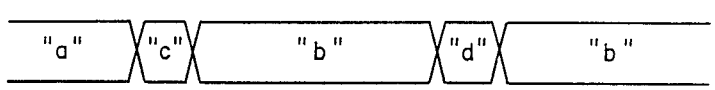
Figure 3E:
Figure 3F:
Figure 3G:
Figure 3H:

In a process wherein an external device connected to a memory device changes address data from address "a" to address "b", for example, the address signal $A_1$ changes, and in its transitional condition, the address "c" is generated in unwanted form and it is then decoded. When an address changes in such unwanted form, a certain decoder circuit operates as shown in FIG. 3E, and a certain decoder circuit operates as shown in FIG. 3G. But, another decoder circuit operates in unwanted way as shown in an FIG. 3F, and it is unnecessary to provide such output. Accordingly, unwanted AC power consumption occurs in the memory device, increasing total power consumption. Such power consumption is also generated in the case wherein a noise signal as indicated by P in FIG. 3A is added to the address signal line, even when an external device does not change address data. In this case, the unwanted address "d" as shown in FIG. 3D is generated, an output $X_b$ of the decoder circuit which is not required to change may change as shown in FIG. 3G, and an output $X_d$ of the decoder circuit which has decoded the address "d" also changes as shown in FIG. 3H. Thus unwanted power consumption occurs. When an output of the decoder circuit changes, the circuit connected to the succeeding stage thereof operates following such change and unwanted power consumption also occurs as explained above.

Figure 4:
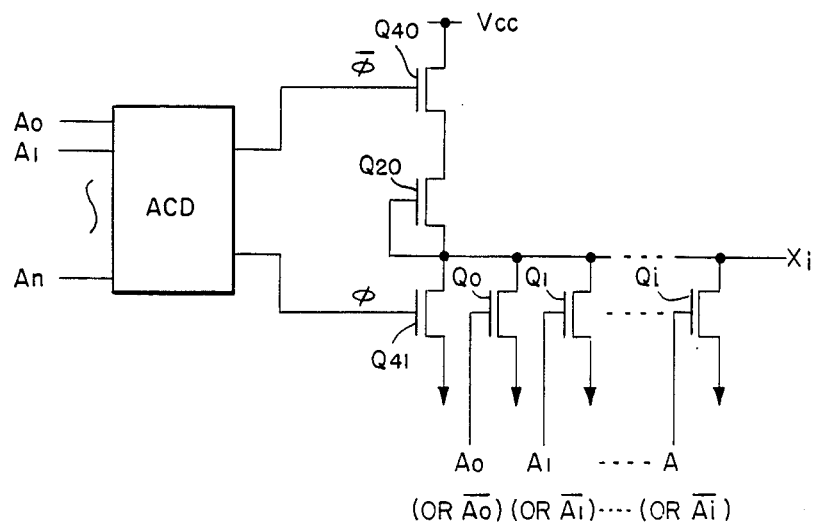
FIG. 4 is an embodiment of a decoder circuit used in an asynchronous semiconductor memory device of this invention.

Thus, this invention proposes a method that the above unwanted power consumption can be prevented by holding the internal circuit in the not-operating condition in response to the address signal for a specified period after change of said address signal by the decoder circuit, as in the embodiment shown in FIG. 4.

Figure 5A:
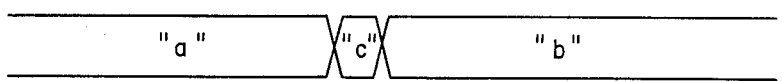
FIG. 5A through FIG. 5F show waveforms for explaining operations of an asynchronous semiconductor memory device of this invention.
Figure 5B:
Figure 5C:
Figure 5D:
Figure 5E:
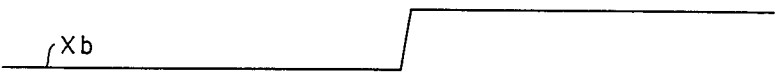
Figure 5F:
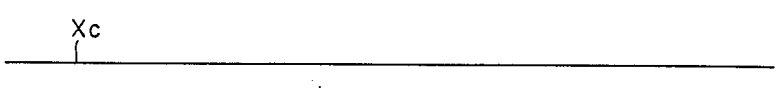

The decoder circuit shown in FIG. 4 is the same as in FIG. 2, except that the enhancement type MOS transistor $Q_{41}$, $Q_{40}$ which receive the control signals $\phi$, $\bar{\phi}$ sent from the address change detector ACD are connected. Operation of the decoder circuit shown in FIG. 4 is explained with reference to FIG. 5A~FIG. 5F. FIG. 5A indicates an address information; FIGS. 5B, 5C indicate control signals $\phi$, $\bar{\phi}$; FIGS. 5D~5F indicate decoder circuit outputs $X_a$, $X_b$, $X_c$ corresponding to address information "a", "b", "c", respectively.

Figure 6:
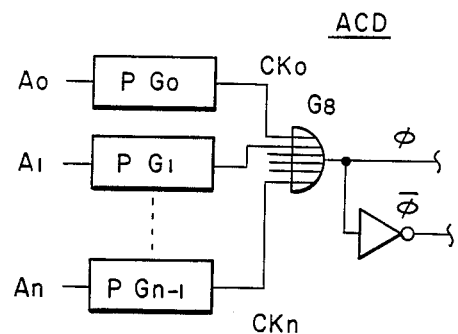
FIG. 6 is a block diagram indicating an example of an address change detector ACD shown in FIG. 4.

The address signals $A_0$, $A_1$, ..., $A_n$ are supplied to the address change detector ACD, and when any one of them changes, the control signals $\phi$ and $\bar{\phi}$ are generated for the specified period as shown in FIGS. 5B, 5C. These control signals $\phi$ and $\bar{\phi}$ are supplied to the transistors $Q_{40}$ and $Q_{41}$ and thereby $Q_{40}$ becomes OFF, while $Q_{41}$ becomes ON. Therefore, all decoder circuits are accordingly separated from power source $V_{cc}$ for a predetermined period from change of address signal, and the decoder circuit outputs are fixed to low level during this period as in FIGS. 5D, 5E, 5F, this predetermined period being indicated by T in FIG. 5B. Even when unwanted address information "c" is generated in the process of an external device changing address from "a" to "b" or by noise, an output $X_c$ of the corresponding decoder circuit does not change as shown in FIG. 5F. Namely, an internal circuit of the memory device is held in the not-operating condition in response to change of address signal, and unwanted power consumption can be prevented. The transistors $Q_{40}$ and $Q_{41}$ thus provide a means for holding the internal circuit in the not-operating state. As an address change detector ACD, for example, a circuit shown in FIGS. 6, 7 as disclosed in U.S. Ser. No. 393,119, now U.S. Pat. No. 4,514,831 may be used.

Figure 7:
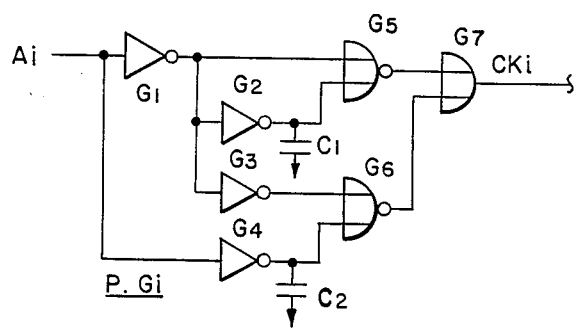
FIG. 7 is a schematic diagram indicating an example of a pulse generator shown in FIG. 6.

In FIG. 7, $G_1$~$G_4$ are inverter gates; $G_5$, $G_6$ are NOR gates; and $G_7$ is an OR gate. These are connected as shown in the figure. This circuit receives 1 bit $A_i$ of the address signals $A_0$~$A_n$ and outputs the clock $CK_i$ in the pulse width T. The circuit $PG_i$ of FIG. 7 is provided for each bit of the address signal, and outputs of the circuits PG0, PG1, ..., PGn-1 are coupled to the OR gate $G_8$ shown in FIG. 6. Operations of these circuits are simply explained. When address signal $A_i$ changes to high level from low level, the output of inverter $G_1$ becomes high level and the output of invertor $G_2$ is slightly delayed by a capacitor $C_1$ and becomes low level. Accordingly, an output of the NOR gate $G_5$ becomes pulse generated at the rising time of the address signal $A_i$. A system of the invertors $G_3$, $G_4$, capacitor $C_2$ and NOR gate $G_6$ also operates in the same way, but its output is a pulse which is generated at the rising time of the address signal $A_i$. The signal $CK_i$ obtained by combining these signals in the OR gate $G_7$ is a pulse generated when address signal $A_i$ changes. An output $\phi$ combines the outputs of the plurality of pulse generators PG$_0$ to PG$_{n-1}$ in FIG. 6 in the OR gate $G_8$ as a control signal which is generated when a desired bit of the address signal changes.

Figure 8:
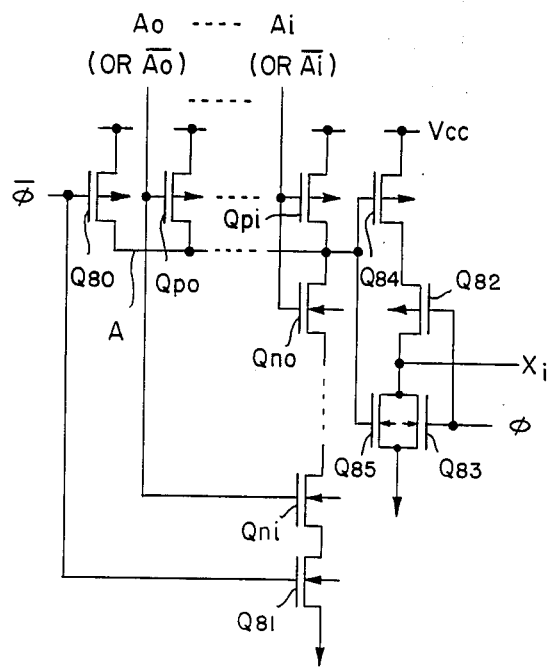
FIG. 8 is another embodiment of decoder circuit of this invention.

FIG. 8 shows another embodiment of this invention, namely a decoder circuit composed of a CMOS circuit with cmplimentary MOS transistor. In this figure, $Q_{p0}$~$Q_{pi}$ and $Q_{80}$, $Q_{82}$, $Q_{84}$ are P channel MOS transistors ($Q_{80}$, $Q_{82}$ and $Q_{84}$ corresponding to second, fourth and first transistors, respectively); $Q_{n0}$~$Q_{ni}$ and $Q_{81}$, $Q_{83}$, $Q_{85}$ are N channel MOS transistors ($Q_{81}$ and $Q_{83}$ corresponding to third and fifth transistors, respectively, a terminal of $Q_{81}$ and $Q_{83}$ connected to ground). In this circuit, the transistors $Q_{80}$~$Q_{83}$ are newly provided in order to set forth this invention. In this circuit, when $A_0$~$A_i$ become high level, the decoder output X also becomes high level. Thereby, an address change is detected by the abovementioned address change detector ACD. When the control signal $\phi$ becomes high level and $\bar{\phi}$ becomes low level, the transistor $Q_{80}$ becomes ON and the transistor $Q_{81}$ becomes OFF, and accordingly the point A is fixed to high level without relation to address information. On the other hand, the transistor $Q_{82}$ becomes OFF and the transistor $Q_{83}$ becomes ON, thus fixing a decoder output to low level. Therefore, as in the case of an embodiment of FIG. 4, an internal circuit of the memory device does not operate in response to the change of the address signal for a specified period (T) from the change of the address signal, and thereby power consumption can be reduced.

In above embodiment, it is prevented that an internal circuit in the succeeding stage operates in response to a change of the address signal, by making invalid the operation of the decoder for a specified period from the change of the address signal, but it is of course possible to make invalid the operation of other circuit blocks.

According to this invention, a memory device does not respond to an unwanted address signal generated in the course of changing an address signal to be input to the memory device or to an unwanted address signal generated when noise is added to the address signal line, and thereby unwanted power consumption can be prevented.

We claim:

1. An asynchronous semiconductor memory device comprising:
an internal circuit for receiving an address signal and operating in response to said address signal, said internal circuit comprising:
a power supply line for supplying an operating voltage; and a decoder circuit, connected to said power supply line, for receiving said address signal and said operating voltage and outputting a decoded output signal;

detecting means, connected to receive said address signal, for detecting a change of said address signal and for generating a respective detection output pulse having a predetermined width corresponding to a specified period; and holding means, connected to said decoder circuit, for holding said internal circuit in a non-operating condition for said specified period, in response to each said detection output pulse in accordance with each respective change of said address signal, said holding means comprising:

a first transistor, connected between said power supply line and said decoder circuit, and connected to said detecting means, being controlled by said detection output pulse for disconnecting said decoder circuit and said power supply line for said specified period; and a second transistor, connected to receive said decoded output signal and connected to said detecting means, being controlled in response to said detection output pulse for grounding said decoder circuit for said specified period.

2. The device of claim 1, wherein said specified period for holding said not-operating condition of said internal circuit by said holding means is determined by said predetermined width of said detection output pulse.

3. An asynchronous semiconductor memory device comprising:

an internal circuit connected to receive an address signal and operating in response to said address signal and including:

a power supply line for supplying an operating voltage; and a plurality of transistors, each of said plurality of transistors having a gate supplied with a respective bit of said address signal;

a first transistor connected to said power supply line; and a decoder circuit having first, second and third terminals, and an output terminal, for receiving said operating voltage and said address signal and outputting a decoded output signal at said output terminal, said first transistor connected in series between said power supply line and said third terminal and having a gate connected to said first terminal;

detecting means, connected to receive said address signal, for detecting a change in said address signal and for generating a respective detection output pulse having a predetermined width; and holding means, connected to said decoder circuit, for holding said internal circuit in a non-operating condition for a specified period corresponding to the predetermined width of said detection output pulse, in response to each said detection output pulse in accordance with each respective change of said address signal, said holding means including:

a second transistor, connected between said power supply line and said first terminal of said decoder, providing said operating voltage to said first terminal of said decoder in accordance with said detection output pulse;

a third transistor, connected between said second terminal of said internal circuit and ground, for cutting off the second terminal of said decoder circuit from ground in accordance with said detection output pulse;

a fourth transistor, connected between said output terminal of said decoder circuit and said third terminal, being controlled in response to said detection output pulse; and a fifth transistor, connected between said output terminal and ground, for connecting said output terminal to ground in accordance with said detection output pulse, said second and fourth transistors being complementary with respect to said third and fifth transistors.

4. The device of claim 3, wherein said specified period for holding said not-operating condition of said internal circuit by said holding means is determined by said predetermined width of said detection output pulse.

* * * * *